(12) United States Patent
Cory et al.

(10) Patent No.: US 6,960,933 B1
(45) Date of Patent: *Nov. 1, 2005

(54) VARIABLE DATA WIDTH OPERATION IN MULTI-GIGABIT TRANSCEIVERS ON A PROGRAMMABLE LOGIC DEVICE

(75) Inventors: Warren E. Cory, Redwood City, CA (US); Hare K. Verma, San Jose, CA (US); Atul V. Ghia, San Jose, CA (US); Paul T. Sasaki, Sunnyvale, CA (US); Suresh M. Menon, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 165 days.

This patent is subject to a terminal disclaimer.

(21) Appl. No.: 10/618,146

(22) Filed: Jul. 11, 2003

Related U.S. Application Data

(63) Continuation of application No. 10/090,286, filed on Mar. 1, 2002, now Pat. No. 6,617,877.

(51) Int. Cl.$^7$ .......................................... H03K 19/177
(52) U.S. Cl. ........................................ 326/38; 326/41
(58) Field of Search .................................. 326/37–41

(56) References Cited

U.S. PATENT DOCUMENTS

| | | |
|---|---|---|
| 5,361,373 A | 11/1994 | Gilson |
| 5,537,601 A | 7/1996 | Kimura et al. |
| 5,652,904 A | 7/1997 | Trimberger |
| 5,671,355 A | 9/1997 | Collins |
| 5,752,035 A | 5/1998 | Trimberger |
| 5,970,254 A | 10/1999 | Cooke et al. |
| 6,020,755 A | 2/2000 | Andrews et al. |
| 6,096,091 A | 8/2000 | Hartmann |
| 6,279,045 B1 | 8/2001 | Muthujumaraswathy et al. |
| 6,282,627 B1 | 8/2001 | Wong et al. |
| 6,343,207 B1 | 1/2002 | Hessel et al. |

OTHER PUBLICATIONS

Cary D. Snyder and Max Baron; "Xilinx's A-to-Z System Platform"; Cahners Microprocessor; The Insider's Guide to Microprocessor Hardware; Microdesign Resources; Feb. 6, 2001; pp. 1-5.

Xilinx, Inc.; "Virtex-II Platform FPGA Handbook"; published Dec. 2000, available from Xilinx, Inc,, 2100 Logic Drive, San Jose, California 95124; pp. 33-75.

*Primary Examiner*—Don Le
(74) *Attorney, Agent, or Firm*—Kim Kanzaki

(57) ABSTRACT

A transmit variable-width interface can be programmed to convert an electronic digital data path that is either 1N, 2N, 4N, or 8N bits wide into a data path that is 2N bits wide, either by serializing bits (4N- or 8N-bit cases), re-clocking bits (2N-bit case), or grouping bits (1N-bit case). A receive variable-width interface can be programmed to convert a data path 2N bits wide into a data path that is 1N, 2N, 4N, or 8N bits wide. The widths of the two variable-width data paths are controlled independently. The variable-width interfaces are coupled between a multi-gigabit transceiver and core logic of a programmable logic device. The incoming and outgoing data paths of the variable-width interfaces have separate clocks signals that are synchronized such that small amounts of skew in these clock signals do not disrupt the operation of the variable-width interfaces.

18 Claims, 16 Drawing Sheets

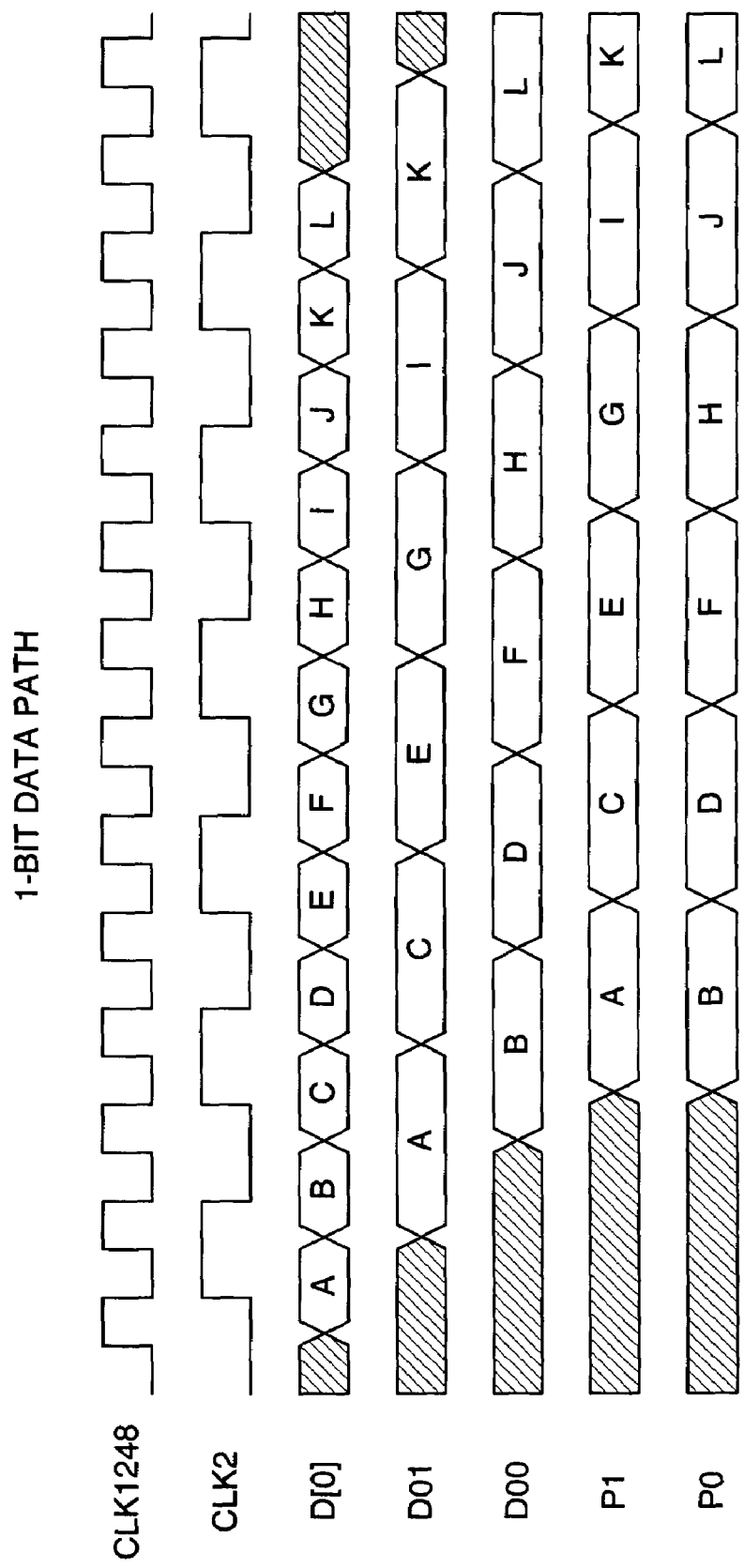

VARIABLE DATA WIDTH OPERATION IN MULTI-GIGABIT TRANSCEIVERS ON A PROGRAMMABLE LOGIC DEVICE

BACKGROUND OF THE INVENTION

1. Field of the Invention

The present invention relates to multi-gigabit transceivers (MGTs) located on a programmable logic device (PLD), such as a field programmable gate array (FPGA). More specifically, the present invention relates to a method and apparatus for providing variable-width data paths for use in the operation of an MGT on a PLD.

2. Related Art

In the past, multi-gigabit transceivers (MGTs) have not been included on programmable logic devices (PLDs) for various reasons. However, commonly owned, copending U.S. patent application entitled "High Speed Configurable Transceiver Architecture" filed concurrently, describes the manner in which MGTs can be included on a PLD, such as a field programmable gate array (FPGA). It would therefore be desirable to optimize the data paths between the core logic of a PLD and the MGTs located on the PLD.

PLD commonly includes one or more data paths, or collections of digital signals routed through the system during processing. The size of a collection, called the "data width" or "data path width" herein, depends on a number of factors. One factor in determining the data path width is the significance of the signals (i.e., the information that the signals represent, and the format of the signals). Another factor is the required speed of operation of the design. Yet another factor is the size constraints introduced by the design. Other factors may also possibly affect the data path width.

In some cases, it may be desirable to modify the width of a data path at some point in the design, changing the extent to which data is propagated in parallel. This may be necessary, for example, because of: different operating speeds in different portions of the design, or different constraints on the data width in different portions of the design. It may also be beneficial for this data width modification to be programmable.

One way of modifying the data path width is to completely modify the design of a system. However, this is a costly manner of modifying the data path width.

PLDS, such as FPGAs, are typically able to implement variable-width data paths by configuring and reconfiguring the PLD. However, such an implementation constitutes an inefficient use of programmable resources that preferably would be reserved for more significant design functions.

It would therefore be desirable to have a PLD capable of implementing a variable-width data path between the core logic of the PLD and the MGTs on the PLD, without requiring use of the programmable resources of the PLD core.

SUMMARY

Accordingly, the present invention provides a transmit variable-width interface that can be programmed to convert an electronic digital data path that is either 1N, 2N, 4N, or 8N bits wide into a data path that is 2N bits wide, either by serializing bits (4N- or 8N-bit cases), re-clocking bits (2N-bit case), or grouping bits (1n-bit case). Conversely, a separate receive variable-width interface can be programmed to convert a data path 2N bits wide into a data path that is 1N, 2N, 4N, or 8N bits wide. The widths of the two variable-width data paths may be controlled independently.

The transmit and receive variable-width interfaces are coupled between an MGT and core logic of a PLD. In one embodiment, the MGT has a fixed internal data width of 2N bits, and the core logic of the PLD exhibits a selectable data width of 1N, 2N, 4N or 8N bits. The transmit variable-width interface operates to transfer variable-width data values from the core logic to the fixed-width data path of the MGT. Conversely, the receive variable-width interface operates to transfer fixed-width data values from the MGT to the variable-width path of the core logic.

The incoming and outgoing data paths of each of the variable-width interfaces have separate clocks signals that are synchronized such that small amounts of skew in these clock signals do not disrupt the operation of the variable-width interfaces. More specifically, these clock signals are synchronized such that falling edges of one clock signal correspond with rising edges of the other clock signal.

The present invention will be more fully understood in view of the following description and drawings.

BRIEF DESCRIPTION OF THE DRAWINGS

FIGS. 7A, 7B, 7C, and 7D are waveform diagrams illustrating the timing of the transmit variable-width interface of FIG. 4 for 1-bit, 2-bit, 4-bit and 8-bit data paths, respectively, in accordance with one embodiment of the present invention.

DETAILED DESCRIPTION

Figure 1:
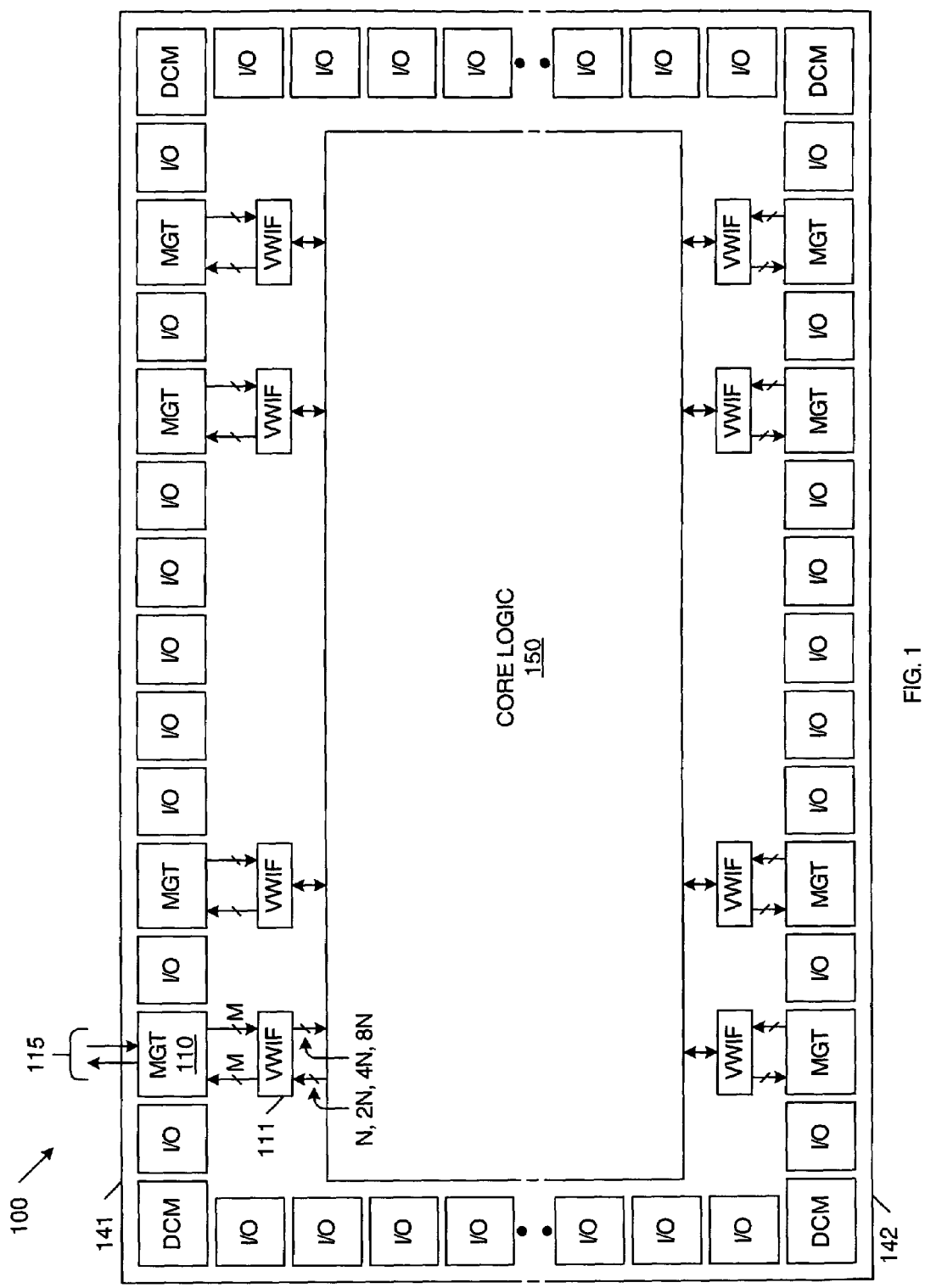
FIG. 1 is a block diagram of a programmable logic device in accordance with one embodiment of the present invention.

FIG. 1 is a block diagram of a programmable logic device (PLD) 100 in accordance with one embodiment of the present invention. In the described embodiment, PLD 100 is a field programmable gate array (FPGA) that includes select I/O blocks (labeled I/O), digital clock managers (labeled DCM) and multi-gigabit transceivers (labeled MGT) located around the perimeter of the device. Each MGT includes a full-duplex differential data channel, such as channel 115. PLD 100 also includes core logic 150, which includes an array of configurable logic blocks (CLBs) and programmable routing circuitry, in the described embodiment. Variable-width interface circuits (labeled VWIF) are located between each of the MGTs and core logic 150. Select I/O blocks I/O, digital clock managers DCM and core logic 150 are well known to those of ordinary skill in the art. These conventional elements of PLD 100 are described in detail in "Virtex™-II Platform FPGA Handbook", December 2000, pages 33–75, available from Xilinx Inc., 2100 Logic Drive, San Jose, Calif. 95124.

PLDS, such as FPGAs, have not previously included multi-gigabit transceivers or variable-width interfaces. As described in more detail below, each of the variable-width interfaces VWIF enables a data path between core logic 150 and the corresponding MGT to have a selectable data path width. For example, variable-width interface VWIF 111 enables data paths to core logic 150 having widths of N, 2N, 4N or 8N, where N is an integer. Both the transmit and receive data paths between VWIF 111 and MGT 110 have widths equal to M, where M is an integer. In the examples described below, M is equal to 2N, although this is not necessary.

Figure 2:
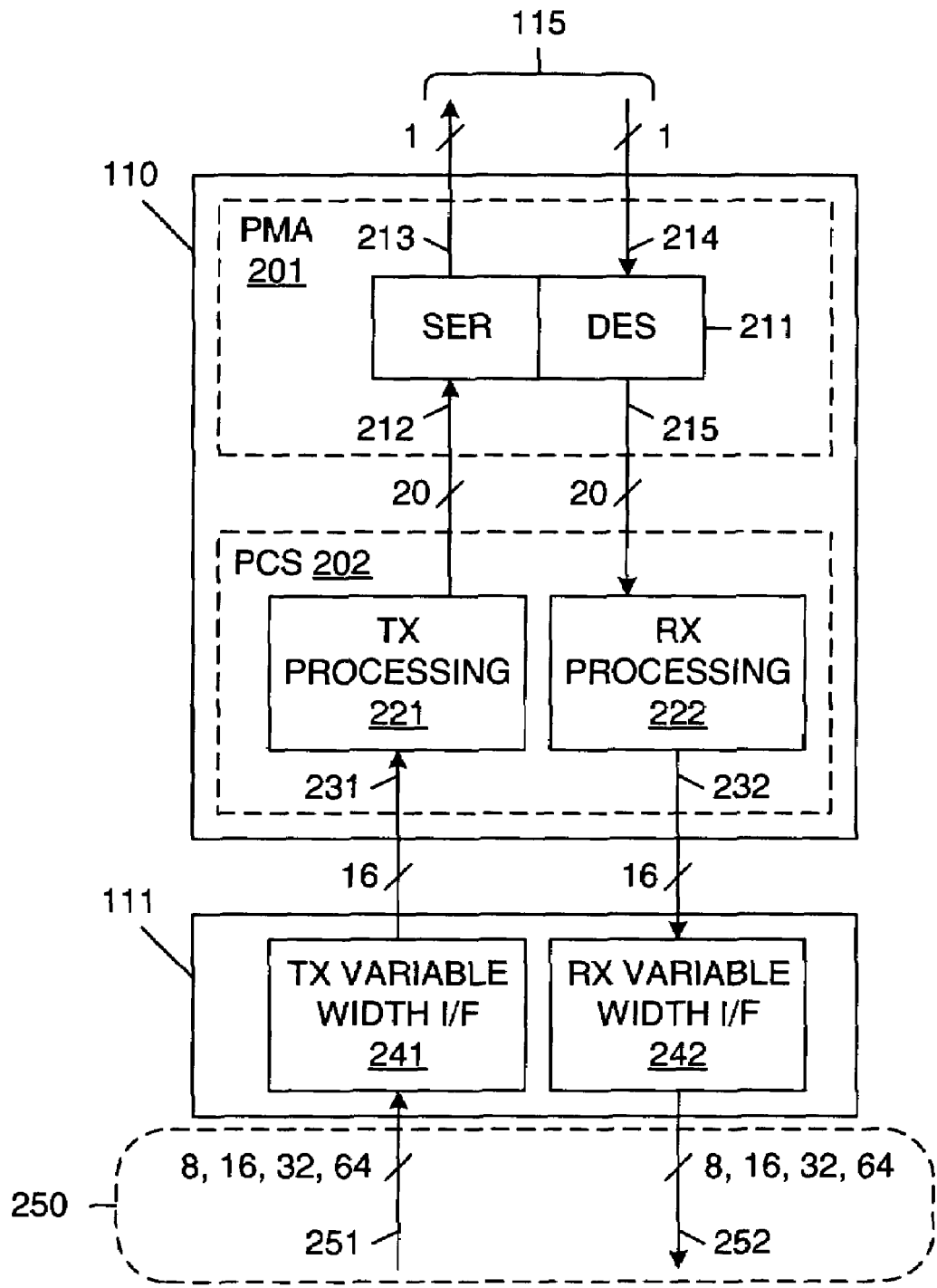
FIG. 2 is a block diagram of a multi-gigabit transceiver and variable-width interface in accordance with one embodiment of the present invention.

FIG. 2 is a block diagram illustrating multi-gigabit transceiver 110 and variable-width interface 111 in accordance with one embodiment of the present invention. MGT 110 includes a physical media access (PMA) sublayer 201, which includes a serializer/deserializer (SERDES) 211 having a 20-bit wide serializer data input port 212, a 1-bit wide serializer data output port 213, a 1-bit wide deserializer data input port 214, and a 20-bit wide deserializer data output port 215. MGT 110 also includes a physical coding sublayer (PCS) 202, which includes transmit processing block 221 and receive processing block 222 coupled to the 20-bit wide serializer data input port 212 and the 20-bit wide deserializer data output port 215, respectively. Although MGTs have not previously been included on programmable logic devices, the various elements of MGTs are well known to those of ordinary skill in the art.

Transmit processing block 221 includes a 16-bit wide transmit data input bus 231, and receive processing block 222 includes a 16-bit wide receive data output bus 232. Thus, in the described embodiment, M is equal to 16. The widths of transmit data input bus 231 and receive data output bus 232 are fixed in the described embodiment. Transmit data input bus 231 and receive data output bus 232 are coupled to variable-width interface 111. More specifically, transmit data input bus 231 is coupled to transmit variable-width interface 241, and receive data output bus 232 is coupled to receive variable-width interface 242. Both transmit variable-width interface 241 and receive variable-width interface 242 are coupled to the programmable interconnect resources 250 of core logic 150.

In accordance with one embodiment, variable-width interface 111 supports a variable-width transmit data path 251, which is created from programmable interconnect resources 250, having a width of 8-bits, 16-bits, 32-bits or 64-bits. Similarly, variable-width interface 111 supports a variable-width receive data path 252, which is created from programmable interconnect resources 250, having a width of 8-bits, 16-bits, 32-bits or 64-bits. Thus, in the described embodiment, N is equal to 8. The variable-width data paths 251–252 can be controlled to have the same width, or different widths, in different embodiments of the present invention. Advantageously, the variable-width data paths 251–252 can have a smaller width, the same width, or a wider width with respect to the width of data paths 231–232. This provides flexibility in operating PLD 100.

Simplified representations of transmit variable-width interface 241 and receive variable-width interface 242 will now be described in more detail. As described above, M is equal to 16 and N is equal to 8 in the example illustrated by FIG. 2. However, the following simplified examples describe a transmit variable-width interface and a receive variable-width interface having a width M equal to two and a width N equal to 1. Given these examples, one of ordinary skill can easily expand these interfaces to create larger interfaces, such as the one defined by FIG. 2. With N equal to 1, variable-width data paths 251–252 can have widths equal to 1-bit, 2-bits, 4-bits and 8-bits. With M equal to 2, fixed-width data paths 231–232 have widths equal to 2-bits.

FIGS. 3A, 3B, 3C and 3D show the clock waveforms (CLK1248) used to control the variable-width 1-bit, 2-bit, 4-bit and 8-bit data paths, respectively, as well as the clock waveform (CLK2) used to control the fixed-width 2-bit data paths within variable-width interface 111. The waveforms shown in FIGS. 3A–3D indicate not only the relative frequencies of the two clock signals CLK2 and CLK1248, but also their phase relationship.

The described design assumes that all flip-flops (described below) in transmit variable-width interface 241 and receive variable-width interface 242 are positive edge triggered. The described design also assumes that in order to eliminate flip-flop hold time as a critical design issue, it is required that rising (positive) edges of the CLK2 and CLK1248 signals are not aligned. The latter requirement is met by defining the clock waveforms CLK2 and CLK1248 such that the rising edges of the slower clock signal are aligned with falling edges of the faster clock signal. In the case of the 2-bit data path (FIG. 3B), either clock signal CLK2 or clock signal CLK1248 may be regarded as the "faster" or "slower" clock signal for the purpose of this requirement.

In a programmable FPGA environment, the clock waveforms defined in FIGS. 3A–3D may be generated without additional external components using a single digital clock manager DCM (FIG. 1) located on PLD 100. Each DCM is similar in functionality to a phase-locked loop (PLL). FIG. 4 is a circuit diagram of a transmit variable-width interface 400 in accordance with one embodiment of the present invention. This interface 400 roughly corresponds with transmit variable-width interface 241 illustrated in FIG. 2. Transmit variable-width interface 400 includes flip-flops A00–A7, multiplexers M1–M2, flip-flops B0–B1 and half-cycle delay 401. Flip-flops A00–A01 receive input data signal D[0], and flip-flops A7–A1 receive input data signals D[7:1], respectively, from a data path corresponding to variable-width data path 251. Flip-flops A00–A7 are clocked by the CLK1248 signal, and provide output data signals D00–D7, respectively. Multiplexer M0 receives data values D00, D2, D4 and D6 on the "00", "01", "11" and "10" input terminals, respectively. Multiplexer M0 is controlled by control signals S1 and S0. Multiplexer M1 receives data values D01, D1, D3, D5 and D7 on the "100", "000", "001", "011" and "010" input terminals, respectively. Multiplexer M1 is controlled by control signals S2, S1 and S0. Multiplexers M0 and M1 route data signals to flip-flops B0 and B1, respectively. Flip-flops B0 and B1 are clocked in response to the CLK2 signal, and provide the output signals P0 and P1, respectively.

Transmit Interface

Figure 4:
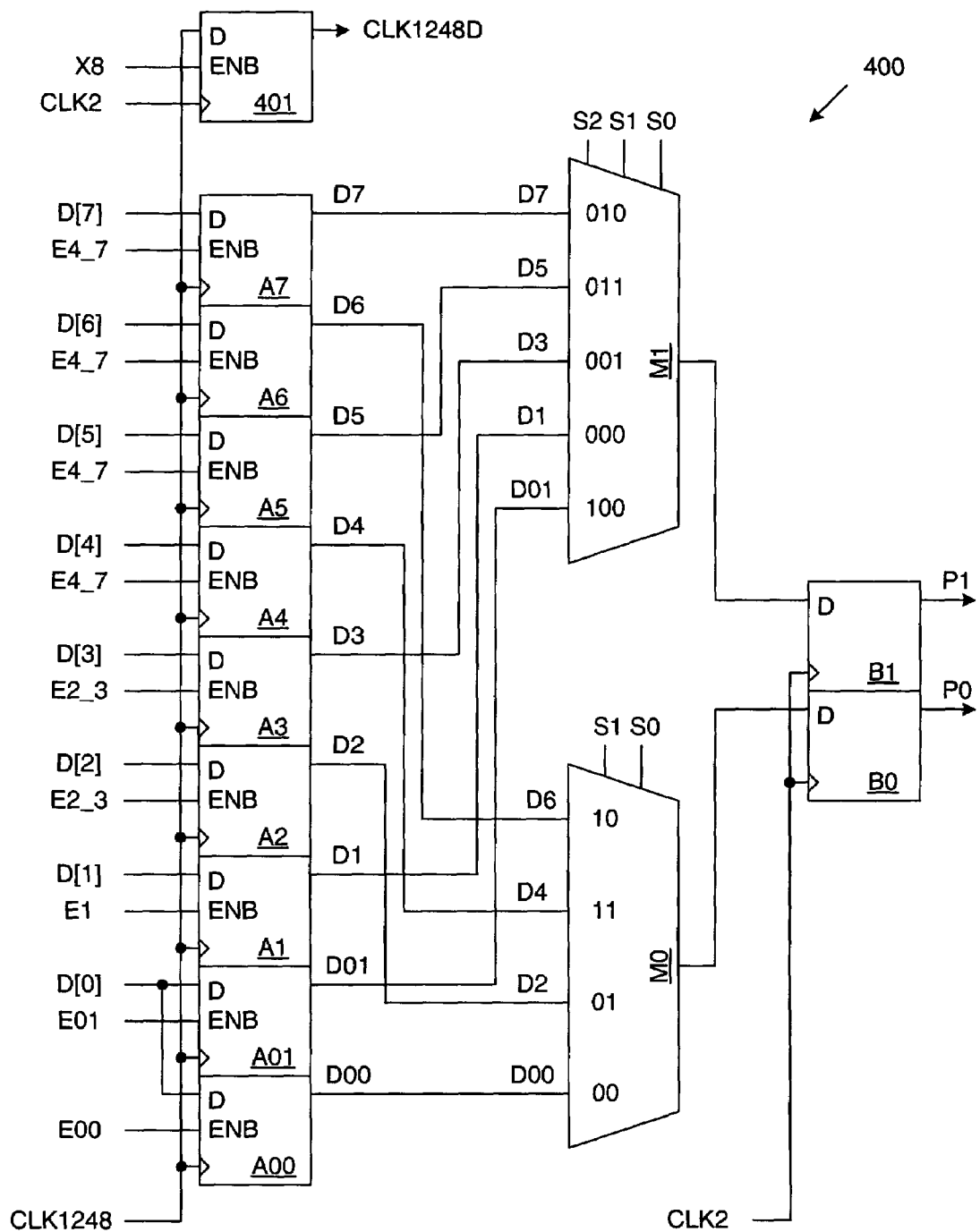
FIG. 4 is a circuit diagram of a transmit variable-width interface in accordance with one embodiment of the present invention.
Figure 5:
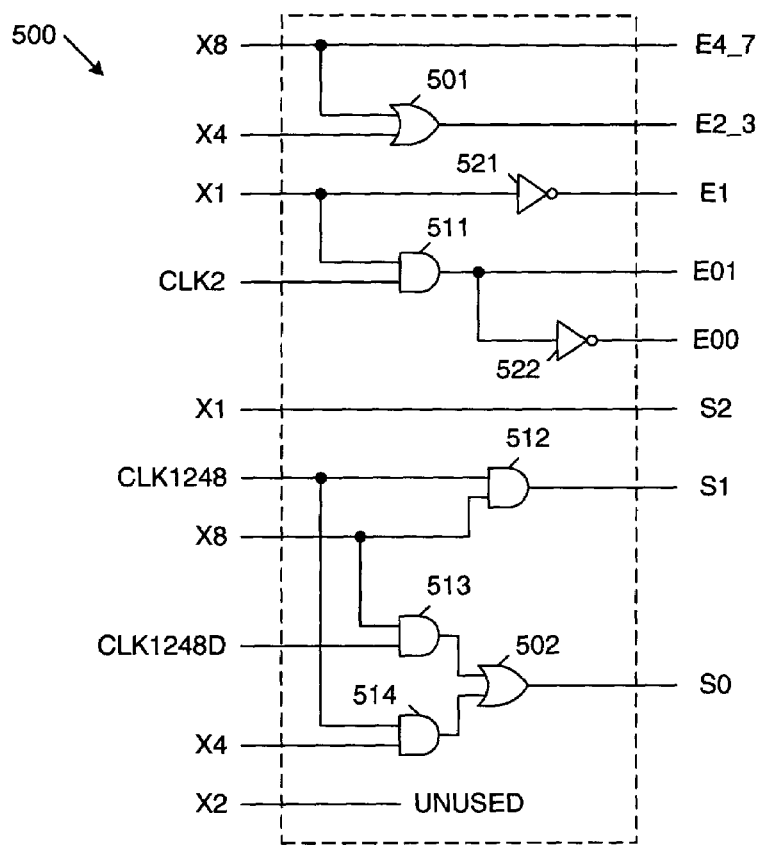
FIG. 5 is a circuit diagram of a transmit width control circuit used to control the transmit variable-width interface of FIG. 4, in accordance with one embodiment of the present invention.

FIG. 5 is a circuit diagram of a transmit width control circuit 500 used to control transmit variable-width interface 400 of FIG. 4. Transmit width control circuit 500 generates the control signals required to operate transmit variable-width interface 400. Transmit width control circuit 500 includes OR gates 501–502, AND gates 511–514 and inverters 521–522, which are configured as illustrated to generate the enable signals E4_7, E2_3, E1, E01, and E00 and the select signals S2, S1 and S0.

The data inputs to the transmit variable-width interface 400 include D[7:0] (for the 8-bit data path), D[3:0] (for the 4-bit data path), D[1:0] (for the 2-bit data path), and D[0] (for the 1-bit data path). The clock inputs to transmit variable-width interface 400 include the CLK1248 clock signal (for the input variable-width data path), and the CLK2 signal (for the output 2-bit data path). The control inputs to interface 400 include width control signals X1, X2, X4, and X8 (for variable data-width selection). One and only one of width control signals X1, X2, X4 or X8 is set to a logic high ("1") value, thereby identifying the selected data path width as 1-bit, 2-bits, 4-bits or 8-bits, respectively. Although the X2 control signal is not directly used in the described example, it is understood that this control signal X2 can be used in other variations. Transmit variable-width interface 400 provides a 2-bit output signal P[1:0].

Transmit variable-width interface 400 and control circuit 500 operate as follows. First, the user determines the desired width of the data path into interface 400. The values of the width control signals X1, X2, X4 and X8; the CLK1248 signal; and the input data values are then determined by this desired width. Table 1 below summarizes the values of the width control signals, the CLK1248 signal, and the input data values for the selected widths of 1-bit, 2-bits, 4-bits and 8-bits.

TABLE 1

Figure 3A:
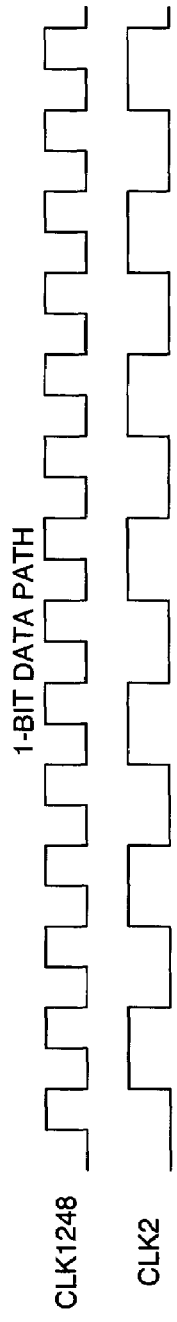
FIGS. 3A, 3B, 3C and 3D show the clock waveforms (CLK1248) used to control variable-width 1-bit, 2-bit, 4-bit and 8-bit data paths, respectively, as well as the clock waveform (CLK2) used to control fixed-width 2-bit data paths in accordance with one embodiment of the present invention.
Figure 3B:
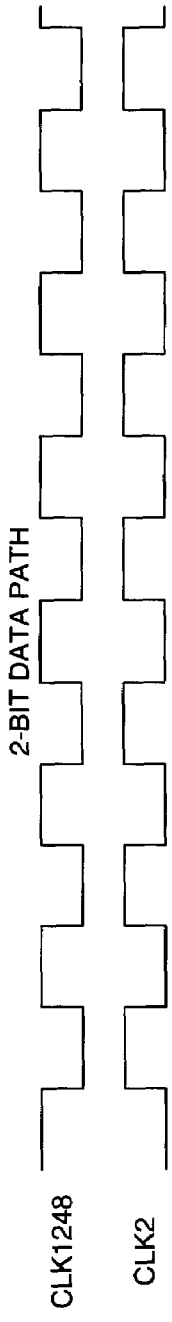
Figure 3C:
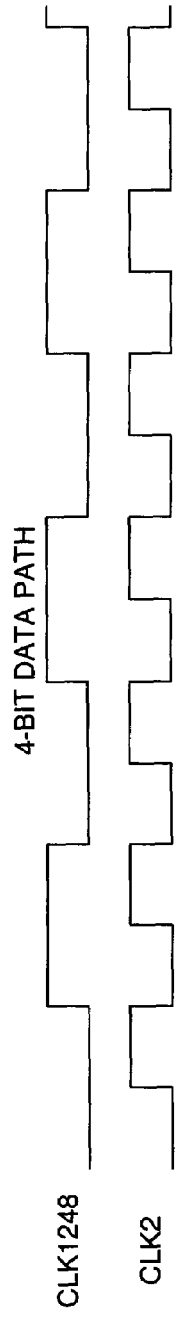
Figure 3D:
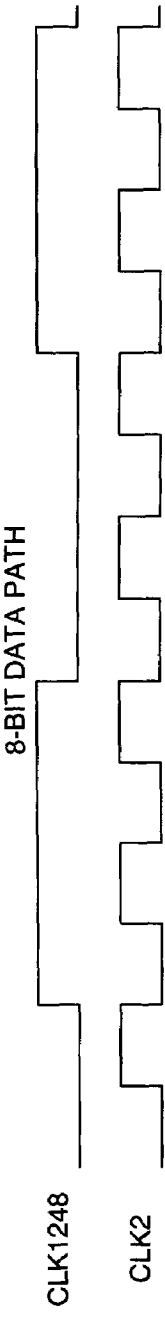

| Width | X8 | X4 | X2 | X1 | CLK1248 | Data |
|-------|----|----|----|----|---------|------|
| 1-bit | 0 | 0 | 0 | 1 | FIG. 3A | D[0] |
| 2-bits | 0 | 0 | 1 | 0 | FIG. 3B | D[1:0] |
| 4-bits | 0 | 1 | 0 | 0 | FIG. 3C | D[3:0] |
| 8-bits | 1 | 0 | 0 | 0 | FIG. 3D | D[7:0] |

Figure 6:
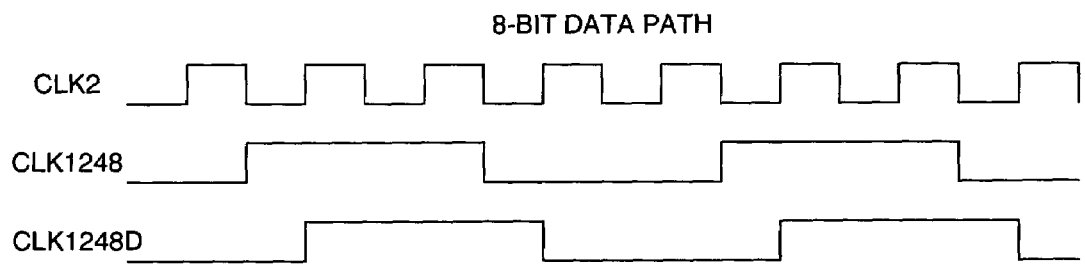
FIG. 6 is a waveform diagram illustrating the relationship between the CLK2 signal, the CLK1248 signal and a delayed CLK1248 signal (CLK1248D), which is enabled when an 8-bit variable-width data path is selected in accordance with one embodiment of the present invention.

The CLK1248D clock signal is generated as follows. Half cycle delay flip-flop 401 includes a clock terminal coupled to receive the CLK2 signal, a data input terminal coupled to receive the CLK1248 signal, and an enable terminal coupled to receive the X8 width control signal. If the X8 width control signal has a logic "0" value (i.e., during 1-bit, 2-bit and 4-bit operation), then the CLK1248D signal is held at a reset value of "0". However, if the X8 width control signal has a logic "1" value, then flip-flop 401 is enabled. In this case, delay flip-flop 401 causes the CLK1248D signal to lag the CLK1248 signal by one half cycle of the CLK2 signal. FIG. 6 is a waveform diagram illustrating the relationship between the CLK2, CLK1248 and CLK1248D signals when the X8 width control signal has a logic "1" value.

The various widths of transmit variable-width interface 400 will now be described in detail.

1-Bit Data Path

When transmit variable-width interface 400 is configured to have a 1-bit width, the X8, X4, X2, X1 signals have values of (0,0,0,1) as illustrated in Table 1. In this case, transmit width control circuit 500 generates enable signals E4_7, E2_3, E1, E01 and E00, and select signals S2, S1 and S0 as illustrated in Table 2. Note that the symbol "#" identifies the inverse of a signal. Also note that the enable signals are labeled to identify the flip-flops A00–A7 (FIG. 4) that they enable. Thus, enable signal E4_7 enables flip-flops A4–A7, enable signal E2_3 enables flip-flops A2–A3, enable signal E1 enables flip-flop A1, enable signal E01 enables flip-flop A01, and enable signal E00 enables flip-flop A00.

TABLE 2

| E4_7 | E2_3 | E1 | E01 | E00 | S2 | S1 | S0 |
|------|------|----|----|-----|----|----|-----|
| 0 | 0 | 0 | CLK2 | CLK2# | 1 | 0 | 0 |

Turning to FIG. 4, these enable and select values have the following effect in transmit variable-width interface 400. The logic "0" enable signals E4_7, E2_3 and E1 disable flip-flops A1–A7. Enable signals E01 and E00 alternately enable flip-flops A00 and A01 during alternate half-cycles of the CLK2 signal. Each time that flip-flop A01 is enabled, a rising edge of the CLK1248 signal causes the applied 1-bit data value D[0] to be latched into flip-flop A01, and provided as data signal D01. The data signal D01 is applied to the "100" input terminal of multiplexer M1. Data signal D01 is routed through multiplexer M1 to flip-flop B1 in response to select signals S2, S1, S0, which have a value of (1,0,0).

Similarly, each time that flip-flop A00 is enabled, a rising edge of the CLK1248 signal causes the applied 1-bit data value D[0] to be latched into flip-flop A00, and provided as output signal D00. Data signal D00 is applied to the "00" input terminal of multiplexer M0. Data signal D00 is routed through multiplexer M0 to flip-flop B0 in response to select signals S1 and S0, which have a value of (0,0).

Flip-flops B0 and B1 are clocked in response to the rising edges of the CLK2 signal, thereby providing the data signals D00 and D01 as output signals P0 and P1, respectively. The timing of transmit variable-width interface 400 for a 1-bit data path is illustrated in FIG. 7A. Note that the offset between the rising edges of the CLK1248 and the CLK2 signals (which is equal to half the period of the CLK1248 clock signal) allows the interface 400 to exhibit adequate set-up and hold times even if the CLK1248 and CLK2 signals exhibit small amounts of skew.

2-Bit Data Path

When transmit variable-width interface 400 is configured to have a 2-bit width, the X8, X4, X2, X1 signals have values of (0,0,1,0) as illustrated in Table 1. In this case, width control circuit 500 generates enable signals E4_7, E2_3, E1, E01 and E00, and select signals S2, S1 and S0 as illustrated in Table 3.

TABLE 3

| E4_7 | E2_3 | E1 | E01 | E00 | S2 | S1 | S0 |
|------|------|----|----|-----|----|----|----|
| 0 | 0 | 1 | 0 | 1 | 0 | 0 | 0 |

Turning to FIG. 4, these enable and select values have the following effect in transmit variable-width interface 400. The logic "0" enable signals E4_7, E2_3, and E01 disable flip-flops A01 and A2–A7. Enable signals E1 and E00 enable flip-flops A1 and A00, respectively. Each rising edge of the CLK1248 signal causes the bits D[1] and D[0] of the applied 2-bit data value D[1:0] to be latched into flip-flops A1 and A00, and provided as data signals D1 and D00, respectively. The data signal D1 is applied to the "000" input terminal of multiplexer M1. Data signal D1 is routed through multiplexer M1 to flip-flop B1 in response to select signals S2, S1, S0, which have a value of (0,0,0).

Similarly, data signal D00 is applied to the "00" input terminal of multiplexer M0. Data signal D00 is routed through multiplexer M0 to flip-flop B0 in response to select signals S1 and S0, which have a value of (0,0).

Figure 7B:
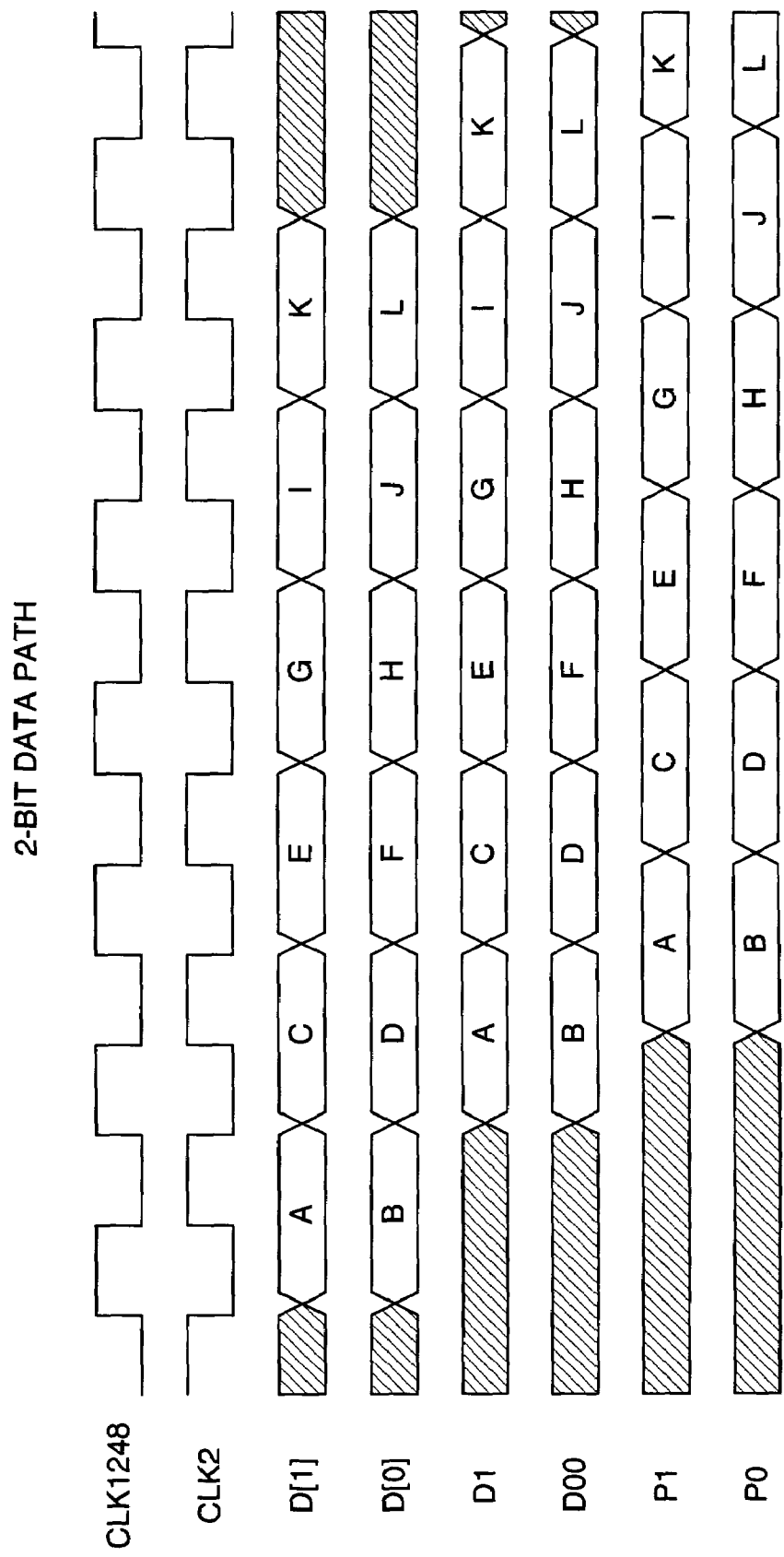

Flip-flops B0 and B1 are clocked in response to the rising edges of the CLK2 signal, thereby providing the data signals D1 and D00 as output signals P0 and P1, respectively. The timing of transmit variable-width interface 400 for a 2-bit data path is illustrated in FIG. 7B. Note that the offset between the rising edges of the CLK1248 and the CLK2 signals (which is equal to half the period of the CLK1248 clock signal) allows the interface 400 to exhibit adequate set-up and hold times even if the CLK1248 and CLK2 signals exhibit small amounts of skew.

4-Bit Data Path

When transmit variable-width interface 400 is configured to have a 4-bit width, the X8, X4, X2, X1 signals have values of (0,1,0,0) as illustrated in Table 1. In this case, width control circuit 500 generates enable signals E4_7, E2_3, E1, E01 and E00, and select signals S2, S1 and S0 as illustrated in Table 4.

TABLE 4

| E4_7 | E2_3 | E1 | E01 | E00 | S2 | S1 | S0 |
|------|------|----|-----|-----|----|----|----|
| 0 | 1 | 1 | 0 | 1 | 0 | 0 | CLK1248 |

Turning to FIG. 4, these enable and select values have the following effect in transmit variable-width interface 400. The logic "0" enable signals E4_7 and E01 disable flip-flops A01 and A4–A7. Enable signals E2_3, E1 and E00 enable flip-flops A3, A2, A1 and A00. Each rising edge of the CLK1248 signal causes the bits D[3], D[2], D[1] and D[0] of the applied 4-bit data value D[3:0] to be latched into flip-flops A3, A2, A1, and A00, and provided as data signals D3, D2, D1 and D00, respectively. The data signals D3 and D1 are applied to the "001" and "000" input terminals of multiplexer M1. The data signals D2 and D00 are applied to the "01" and "00" input terminals of multiplexer M0.

When the CLK1248 signal has a value of "1", data signals D3 and D2 are routed through multiplexers M1 and M0, respectively, to flip-flops B1 and B0, respectively, in response to select signals S2, S1, S0, which have a value of (0,0,1).

When the CLK1248 signal has a value of "0", data signals D1 and D00 are routed through multiplexers M1 and M0, respectively, to flip-flops B1 and B0, respectively, in response to select signals S2, S1, S0, which have a value of (0,0,0).

Figure 7C:
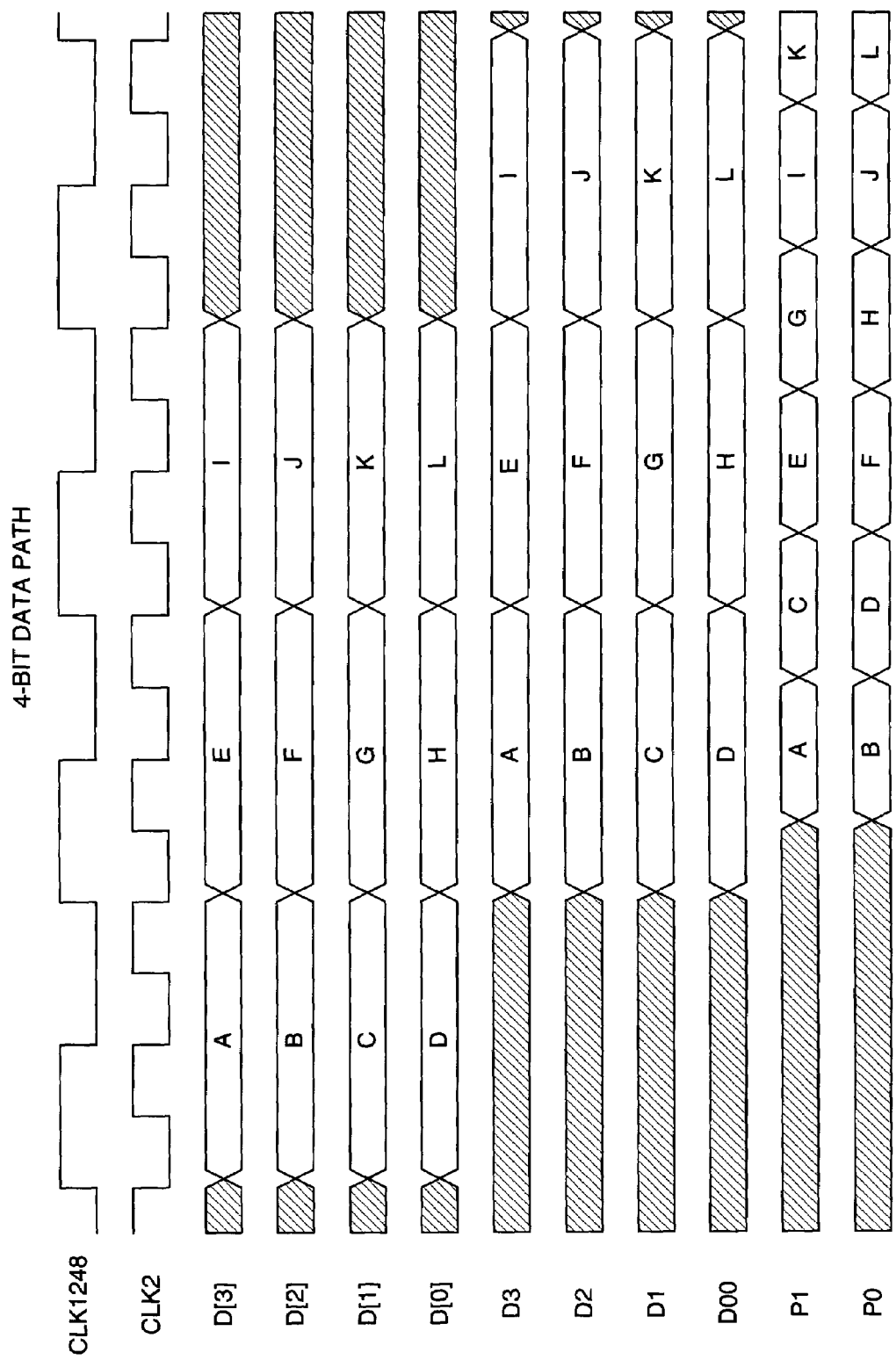

Flip-flops B0 and B1 are clocked in response to the rising edges of the CLK2 signal, thereby providing the data signals D3 and D2 as output signals P0 and P1, respectively, in response to a rising edge of the CLK2 signal, and providing the data signals D1 and D00 as output signals P0 P1, respectively, in response to the next rising edge of the CLK2 signal. The timing of transmit variable-width interface 400 for a 4-bit data path is illustrated in FIG. 7C. Note that the offset between the rising edges of the CLK1248 and the CLK2 signals (which is equal to one quarter of the period of the CLK1248 clock signal) allows the interface 400 to exhibit adequate set-up and hold times even if the CLK1248 and CLK2 signals exhibit small amounts of skew.

8-Bit Data Path

When transmit variable-width interface 400 is configured to have an 8-bit width, the X8, X4, X2, X1 signals have values of (1,0,0,0) as illustrated in Table 1. In this case, width control circuit 500 generates enable signals E4_7, E2_3, E1, E01 and E00, and select signals S2, S1 and S0 as illustrated in Table 5.

TABLE 5

| E4_7 | E2_3 | E1 | E01 | E00 | S2 | S1 | S0 |
|------|------|----|-----|-----|----|---------|----------|
| 1 | 1 | 1 | 0 | 1 | 0 | CLK1248 | CLK1248D |

Turning to FIG. 4, these enable and select values have the following effect in transmit variable-width interface 400. The logic "0" enable signal E01 disables flip-flop A01. The logic "1" enable signals E4_7, E2_3, E1 and E00 enable flip-flops A1–A7 and A00. Each rising edge of the CLK1248 signal causes the bits D[7], D[6], D[5], D[4], D[3], D[2], D[1] and D[0] of the applied 8-bit data value D[7:0] to be latched into flip-flops A7, A6, A5, A4, A3, A2, A1, and A00, and provided as data signals D7, D6, D5, D4, D3, D2, D1 and D00, respectively. The data signals D7, D5, D3 and D1 are applied to the "010", "011", "001" and "000" input terminals of multiplexer M1, respectively. The data signals D6, D4, D2 and D00 are applied to the "10", "11", "01" and "00" input terminals of multiplexer M0, respectively.

Figure 7D:
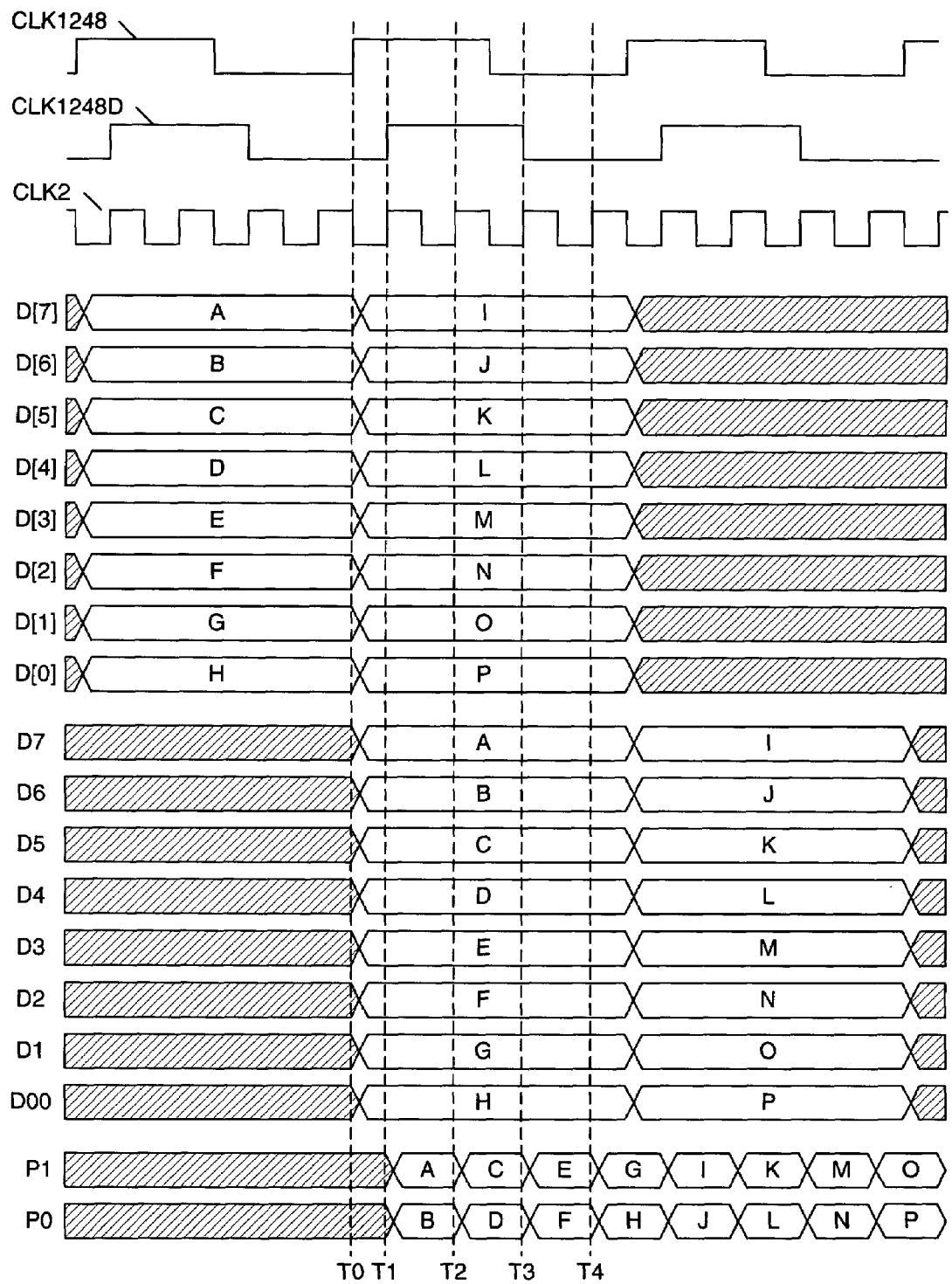

The timing of transmit variable-width interface 400 for an 8-bit data path is illustrated in FIG. 7D. At time T0, the rising edge of the CLK1248 signal causes the data values D[7:0] (i.e., A–H) to be latched into flip-flops A7–A1 and A00 as data signals D7–D0. Prior to time T1, the CLK1248 signal has a logic "1" value and the CLK1248D signal has a logic "0" value. As a result, the S2, S1, S0 signals have a value of (0,1,0), thereby routing data signal D7 (i.e., A) and data signal D6 (i.e., B) through multiplexers M1 and M0, respectively, to flip-flops B1 and B0, respectively. At time T1, the rising edge of the CLK2 signal causes these data signals A and B to be latched into flip-flops B1 and B0, respectively, and provided as output signals P1 and P0.

Just prior to time T2, the CLK1248 signal has a logic "1" value and the CLK1248D signal has a logic "1" value. As a result, the S2, S1, S0 signals have a value of (0,1,1), thereby routing data signal D5 (i.e., C) and data signal D4 (i.e., D) through multiplexers M1 and M0, respectively, to flip-flops B1 and B0, respectively. At time T2, the rising edge of the CLK2 signal causes these data signals C and D to be latched into flip-flops B1 and B0, respectively, and provided as output signals P1 and P0.

Just prior to time T3, the CLK1248 signal has a logic "0" value and the CLK1248D signal has a logic "1" value. As a result, the S2, S1, S0 signals have a value of (0,0,1), thereby routing data signal D3 (i.e., E) and data signal D2 (i.e., F) through multiplexers M1 and M0, respectively, to flip-flops B1 and B0, respectively. At time T3, the rising edge of the CLK2 signal causes these data signals E and F to be latched into flip-flops B1 and B0, respectively, and provided as output signals P1 and P0.

Just prior to time T4, the CLK1248 signal has a logic "0" value and the CLK1248D signal has a logic "0" value. As a result, the S2, S1, S0 signals have a value of (0,0,0), thereby routing data signal D1 (i.e., G) and data signal D00 (i.e., H) through multiplexers M1 and M0, respectively, to flip-flops B1 and B0, respectively. At time T4, the rising edge of the CLK2 signal causes these data signals G and H to be latched into flip-flops B1 and B0, respectively, and provided as output signals P1 and P0.

This process is repeated for the next 8-bit data value (i.e., data signals I–P), as illustrated. Note that the offset between the rising edges of the CLK1248 and the CLK2 signals (which is equal to one eighth of the period of the CLK1248 clock signal) allows transmit variable-width interface 400 to exhibit adequate set-up and hold times even if the CLK1248 and CLK2 signals exhibit small amounts of skew.

In the foregoing manner, transmit variable-width interface 400 supports variable data widths of 1-bit, 2-bits, 4-bits and 8-bits in core logic 150, and a fixed data width of 2-bits in MGT 110.

Receive Interface

Figure 8:
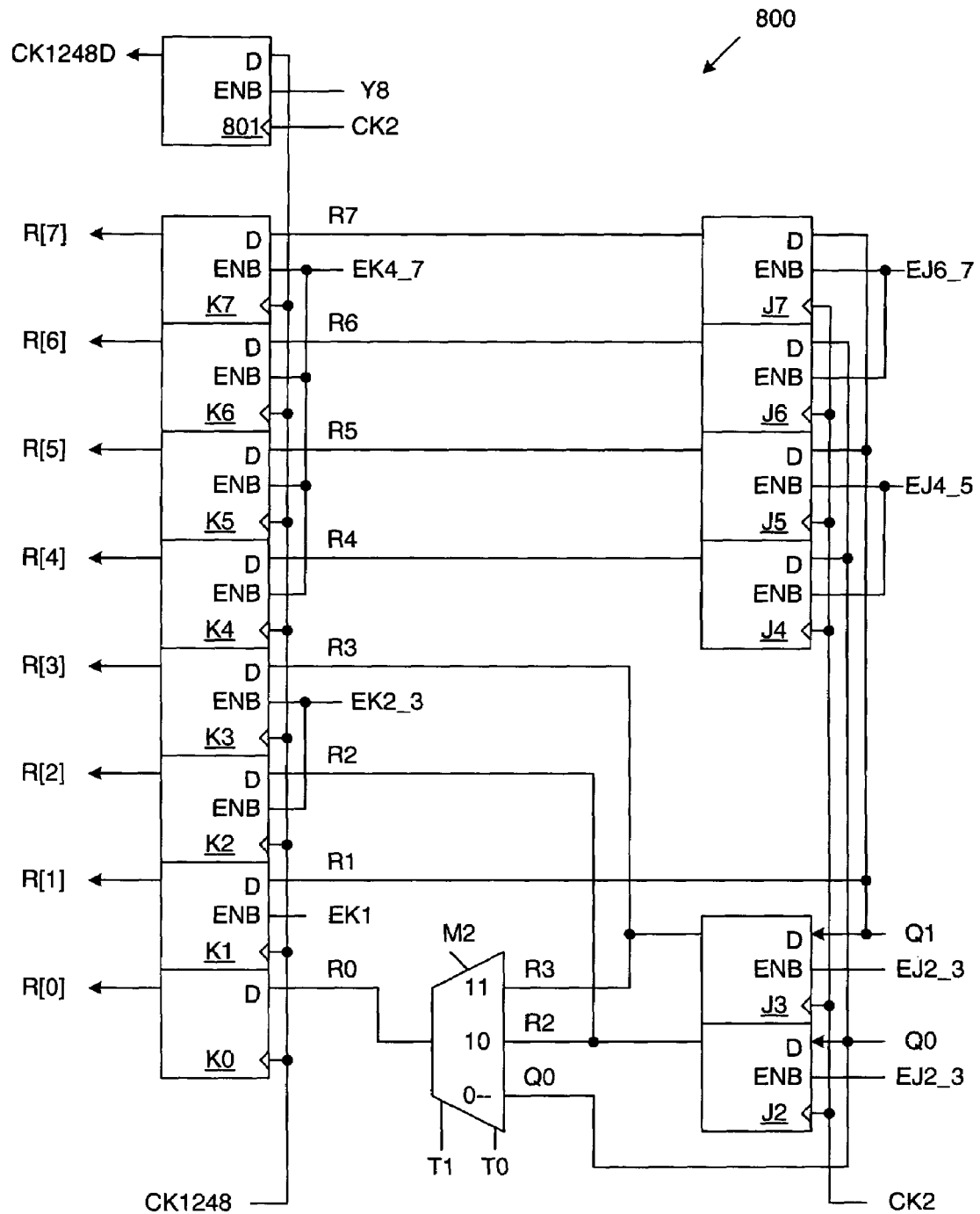
FIG. 8 is a circuit diagram of a receive variable-width interface in accordance with one embodiment of the present invention.

FIG. 8 is a circuit diagram of a receive variable-width interface 800 in accordance with one embodiment of the present invention. This interface 800 roughly corresponds with receive variable-width interface 242 illustrated in FIG. 2. Receive variable-width interface operates in response to clock signals CK2 and CK1248. These clock signals CK2 and CK1248 are different signals than the clock signals CLK2 and CLK1248 described above. However, for purposes of the present description, clock signals CK2 and CK1248 have the same phase relationships as clock signals CLK2 and CLK1248, respectively, illustrated in FIGS. 3A–3D.

Receive variable-width interface 800 includes flip-flops J2–J7, multiplexer M2, flip-flops K0–K7 and half-cycle delay 801. Flip-flops J2, J4 and J6 receive input data signal Q[0], and flip-flops J3, J5 and J7 receive input data signal Q[1], from a data path corresponding to fixed width data path 232 (FIG. 2). Flip-flops J2–J7 are clocked by the CK2 signal, and provide output data signals R2–R7, respectively. Multiplexer M2 receives data signals Q0, R2 and R3 on the "0–", "10" and "11", input terminals, respectively. Multiplexer M2 is controlled by control signals T1 and T0. Multiplexer M2 routes a data signal R0 to flip-flop K0. Data signals R1–R7 are provided to flip-flops K1–K7, respectively. Flip-flops K0–K7 are clocked in response to the CK1248 signal, and provide the output signals R[7:0], respectively.

Figure 9:
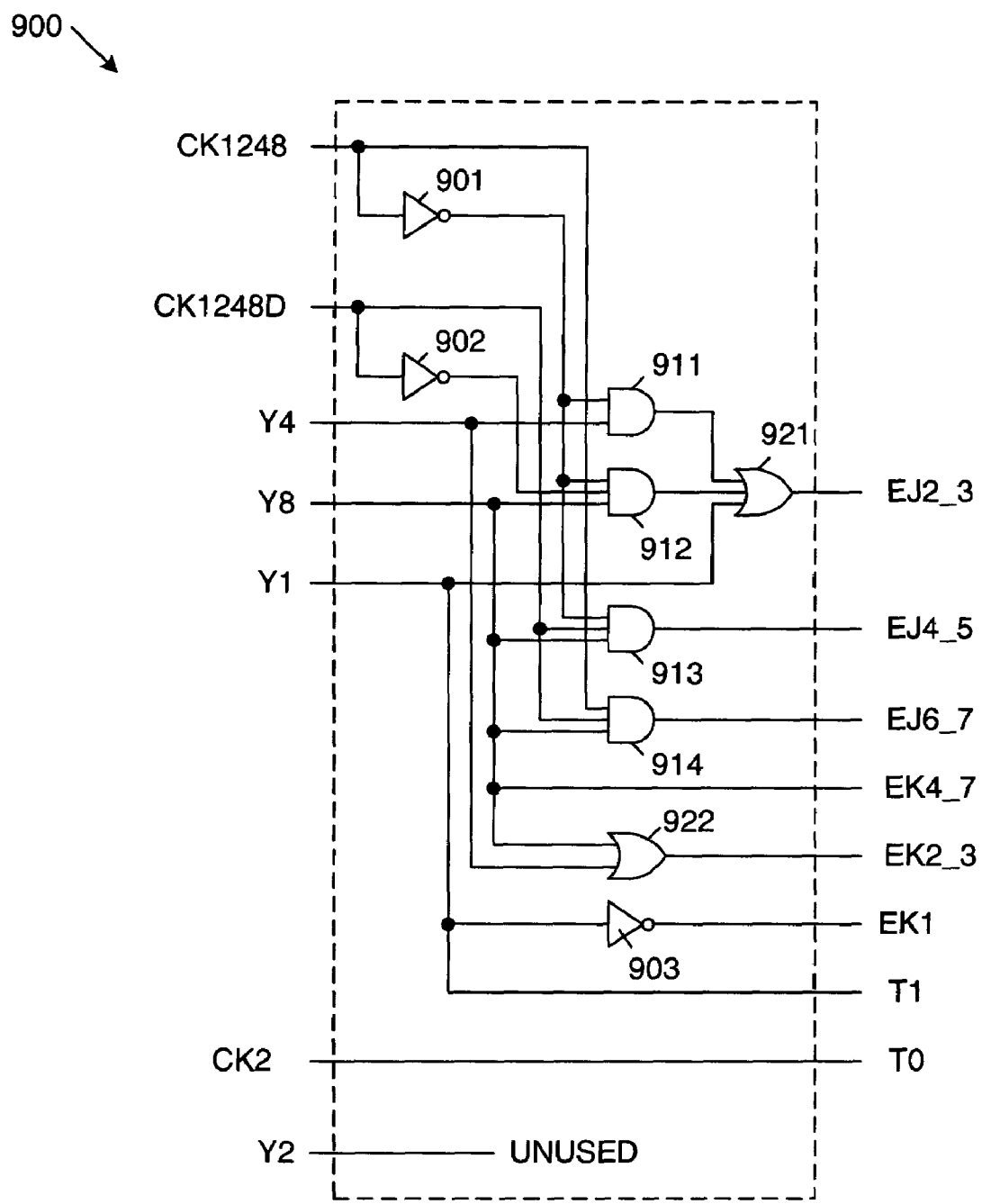
FIG. 9 is a circuit diagram of a receive width control circuit used to control the receive variable-width interface of FIG. 8, in accordance with one embodiment of the present invention.

FIG. 9 is a receive width control circuit 900 used to control receive variable-width interface 800 of FIG. 8. Receive width control circuit 900 generates the control signals required to operate receive variable-width interface 800. Receive width control circuit 900 includes inverters 901–903, AND gates 911–914, and OR gates 921–922, which are configured as illustrated.

A 2-bit input data signal Q[1:0] is provided to interface 800. The data outputs of the variable-width data path include R[7:0] (for the 8-bit data path), R[3:0] (for the 4-bit data path), R[1:0] (for the 2-bit data path), and R[0] (for the 1-bit data path). The clock inputs to receive variable-width interface 800 include the CK1248 clock signal (for the output variable-width data path), and the CK2 signal (for the input 2-bit data path). The control inputs to interface 800 include width control signals Y1, Y2, Y4, and Y8 (for variable data-width selection). One and only one of width control signals Y1, Y2, Y4 or Y8 is set to a logic high ("1") value, thereby identifying the selected data path width as 1-bit, 2-bits, 4-bits or 8-bits, respectively.

Receive variable-width interface 800 and receive width control circuit 900 operate as follows. First, the user determines the desired width of the data path out of interface 800. The values of the width control signals Y1, Y2, Y4 and Y8, the CK1248 signal, and the input data values are then determined by this desired width. Table 6 below summarizes the values of the width control signals, the CK1248 signal, and the output data values for the selected widths of 1-bit, 2-bits, 4-bits and 8-bits.

TABLE 6

| Width | Y8 | Y4 | Y2 | Y1 | CK1248 | Data |
|---|---|---|---|---|---|---|
| 1-bit | 0 | 0 | 0 | 1 | FIG. 3A | R[0] |
| 2-bits | 0 | 0 | 1 | 0 | FIG. 3B | R[1:0] |
| 4-bits | 0 | 1 | 0 | 0 | FIG. 3C | R[3:0] |
| 8-bits | 1 | 0 | 0 | 0 | FIG. 3D | R[7:0] |

Half cycle delay flip-flop 801 generates the CK1248D clock signal in the same manner as flip-flop 401 (See, FIG. 6). The various widths of receive variable-width interface 800 will now be described in detail.

1-Bit Data Path

When receive variable-width interface 800 is configured to have a 1-bit output width, the Y8, Y4, Y2, Y1 signals have values of (0,0,0,1) as illustrated in Table 6. In this case, width control circuit 900 generates enable signals EJ6_7, EJ4_5, EJ2_3, EK4_7, EK2_3 and EK1, and select signals T1 and T0 as illustrated in Table 7. The enable signals are labeled to identify the flip-flops J2–J7 and K0–K7 (FIG. 8) that they enable. Thus, enable signal EJ6_7 enables flip-flops J6 and J7, enable signal EJ4_5 enables flip-flops J4 and J5, enable signal EJ2_3 enables flip-flops J2 and J3, enable signal EK1 enables flip-flop K1, enable signal EK2_3 enables flip-flops K2 and K3, and enable signal EK4_7 enables flip-flops K4–K7. Flip-flop K0 is always enabled.

TABLE 7

| EJ6_7 | EJ4_5 | EJ2_3 | EK4_7 | EK2_3 | EK1 | T1 | T0 |
|---|---|---|---|---|---|---|---|
| 0 | 0 | 1 | 0 | 0 | 0 | 1 | CK2 |

Figure 10A:
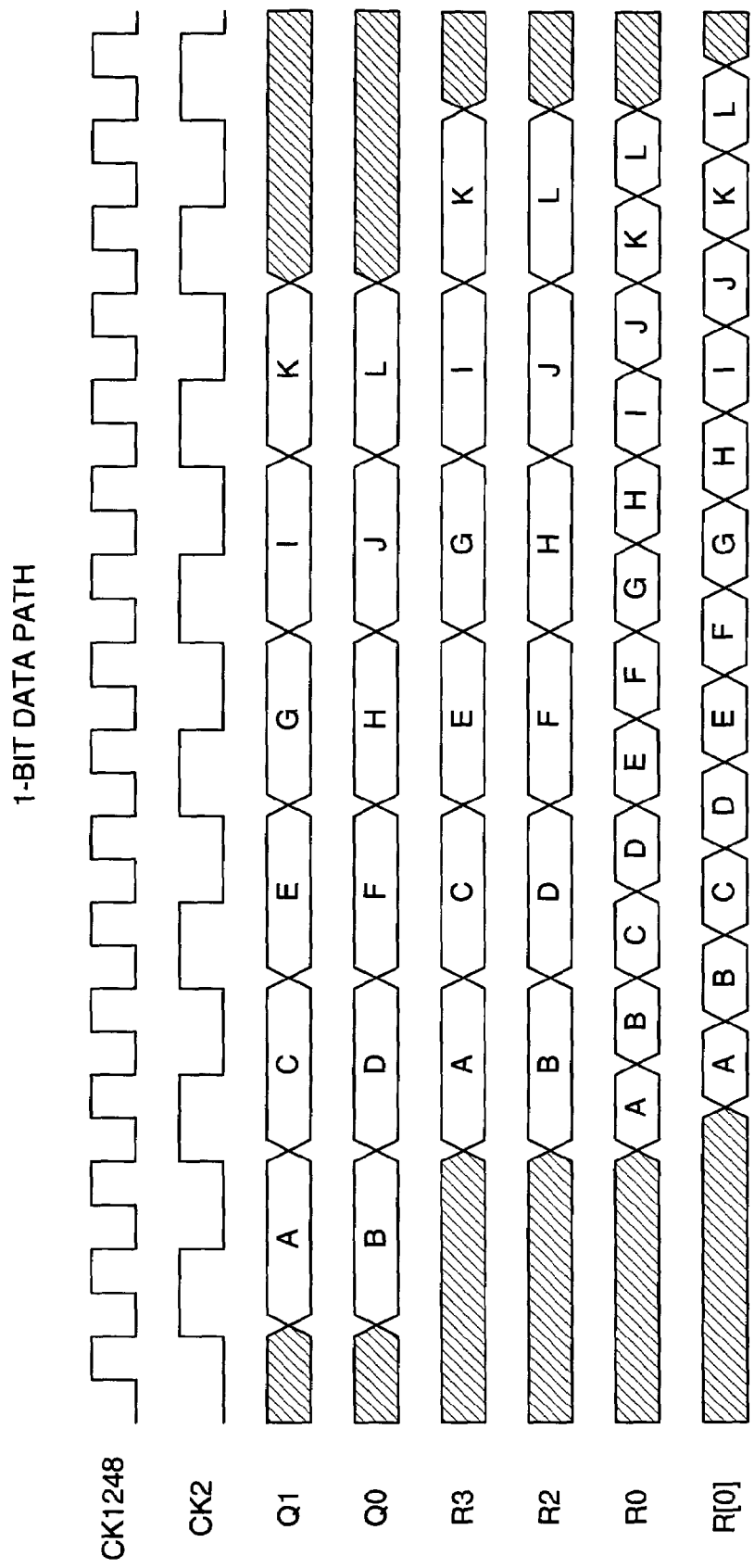
FIGS. 10A, 10B, 10C, and 10D are waveform diagrams illustrating the timing of the receive variable-width interface of FIG. 8 for 1-bit, 2-bit, 4-bit and 8-bit data paths, respectively, in accordance with one embodiment of the present invention.

Turning to FIG. 8, these enable and select values have the following effect in receive variable-width interface 800. The logic "0" enable signals EJ6_7, EJ4_5, EK4_7, EK2_3 and EK1 disable flip-flops J4–J7 and K1–K7. The logic "1" enable signal EJ2_3 enables flip-flops J2 and J3. The received data signals Q0 and Q1 are latched into flip-flops J2 and J3 as data signals R2 and R3, respectively, in response to rising edges of the CK2 signal. Flip-flops J2 and J3 then provide these data signals R2 and R3 to the "10" and "11" input terminals, respectively, of multiplexer M2. The control signals T1–T0 provided to multiplexer M2 transition between values of "11" and "10" in response to the rising and falling edges of the CK2 signal (see, Table 7). Thus, multiplexer M2 will route the R3 data signal, and then the R2 data signal, to flip-flop K0 as the data signal R0. Flip-flop K0 latches the R0 data signal on rising edges of the CK1248 clock signal, thereby providing the 1-bit R[0] data signal. The timing of receive variable-width interface 800 for a 1-bit data path is illustrated in FIG. 10A. Note that the offset between the rising edges of the CK1248 and the CK2 signals (which is equal to half the period of the CK1248 clock signal) allows the interface 800 to exhibit adequate set-up and hold times even if the CK1248 and CK2 signals exhibit small amounts of skew.

2-Bit Data Path

When receive variable-width interface 800 is configured to have a 2-bit output width, the Y8, Y4, Y2, Y1 signals have values of (0,0,1,0) as illustrated in Table 6. In this case, width control circuit 900 generates enable signals EJ6_7, EJ4_5, EJ2_3, EK4_7, EK2_3, and EK1, and select signals T1 and T0 as illustrated in Table 8.

TABLE 8

| EJ6_7 | EJ4_5 | EJ2_3 | EK4_7 | EK2_3 | EK1 | T1 | T0 |
|---|---|---|---|---|---|---|---|
| 0 | 0 | 0 | 0 | 0 | 1 | 0 | CK2 |

Figure 10B:
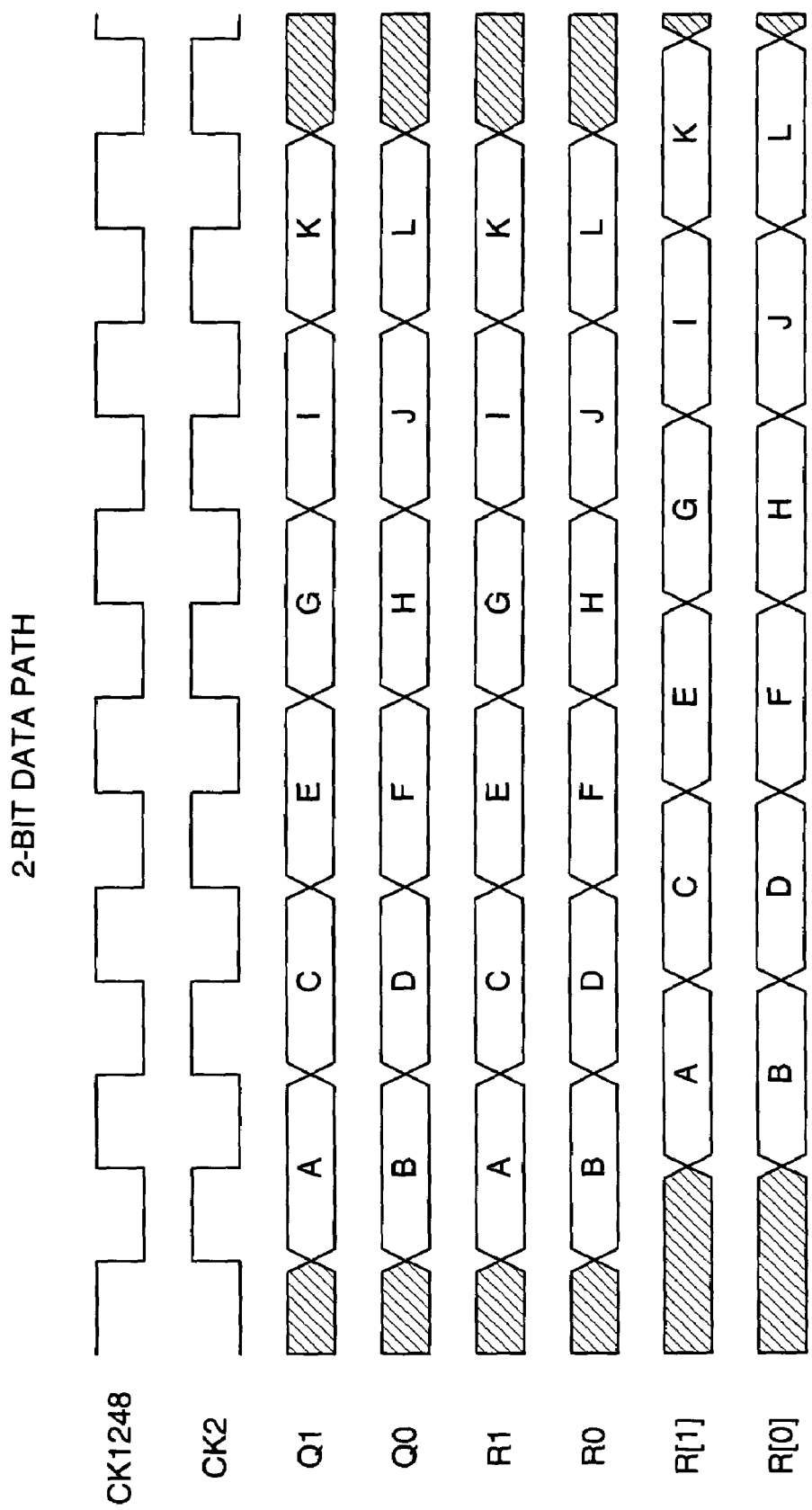

Turning to FIG. 8, these enable and select values have the following effect in receive variable-width interface 800. The logic "0" enable signals EJ6_7, EJ4_5, EJ2_3, EK4_7, and EK2_3 disable flip-flops J2–J7 and K2–K7. The logic "1" enable signal EK1 enables flip-flop K1. The received data signal Q1 is routed directly to flip-flop K1 as data signal R1, and the received data signal Q0 is routed to flip-flop K0 through multiplexer M2 as data signal R0. Note that the logic "0" value of the T1 select signal causes multiplexer M2 to route the Q0 signal, regardless of the state of the CK2 signal. That is, flip-flops J2–J3 are bypassed in the 2-bit data path. The R1 and R0 data signals are latched into flip-flops K1 and K0, respectively, in response to rising edges of the CK1248 clock signal, and provided as 2-bit output signal R[1:0]. The timing of interface 800 for a 2-bit data path is illustrated in FIG. 10B.

4-Bit Data Path

When receive variable-width interface 800 is configured to have a 4-bit output width, the Y8, Y4, Y2, Y1 signals have values of (0,1,0,0) as illustrated in Table 6. In this case, width control circuit 900 generates enable signals EJ6_7, EJ4_5, EJ2_3, EK4_7, EK2_3, and EK1, and select signals T1 and T0 as illustrated in Table 9.

TABLE 9

| EJ6_7 | EJ4_5 | EJ2_3 | EK4_7 | EK2_3 | EK1 | T1 | T0 |
|---|---|---|---|---|---|---|---|
| 0 | 0 | CK1248# | 0 | 1 | 1 | 0 | CK2 |

Figure 10C:
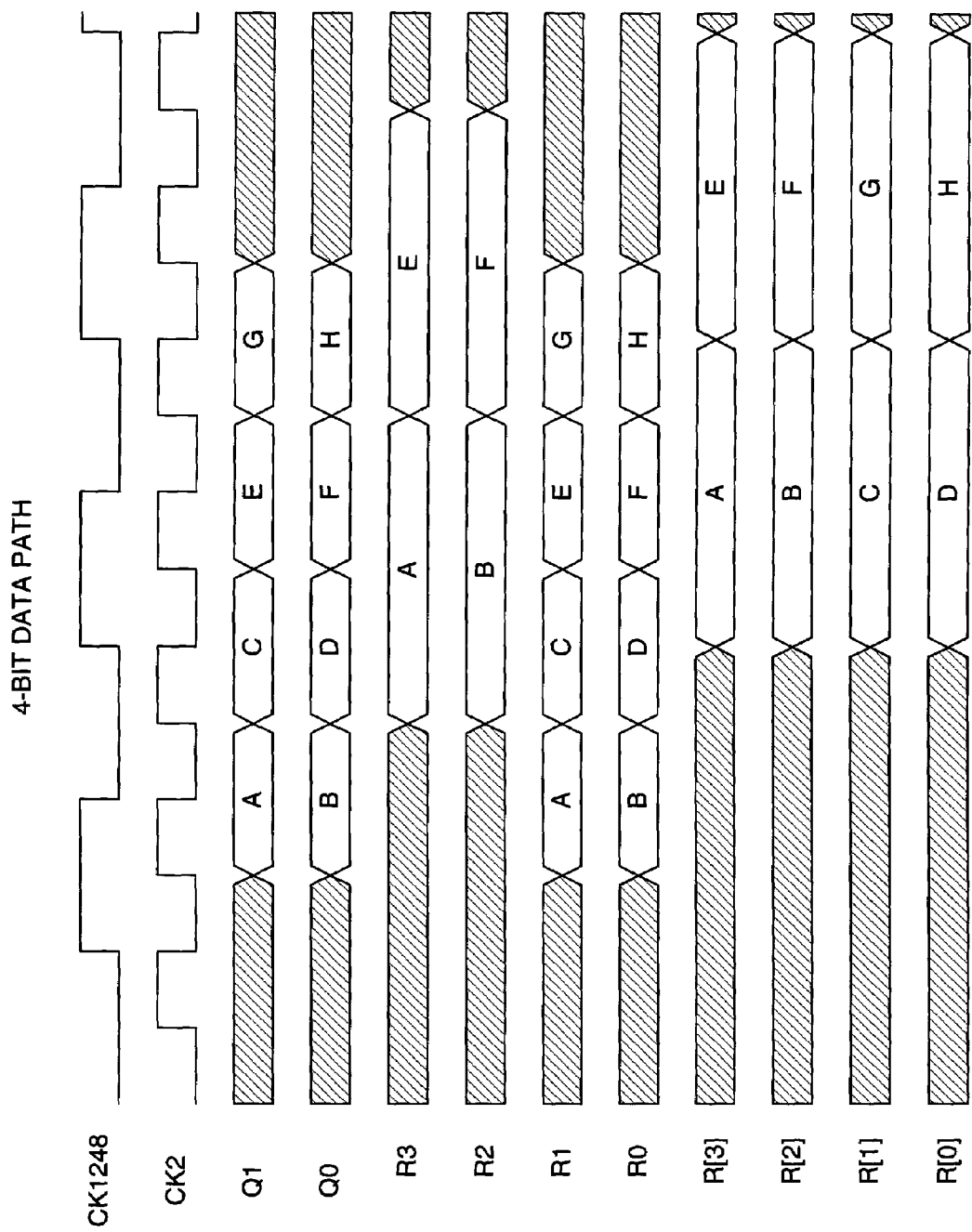

Turning to FIG. 8, these enable and select values have the following effect in receive variable-width interface 800. The logic "0" enable signals EJ6_7, EJ4_5 and EK4_7, disable flip-flops J4–J7 and K4–K7. The logic "1" enable signals EK1 and EK2_3 enable flip-flops K1–K3. The received data signals Q1 and Q0 are latched into flip-flops J3 and J2, respectively, as data signals R3 and R2, respectively, when the CK1248 signal has a logic low value (CK1248#="1") and the CK2 signal has a rising edge. On the same rising edge of the CK2 signal, the Q1 and Q0 data signals transition to represent two new data values. These two new data values propagate directly to flip-flops K1 and K0 as data signals R1 and R0 well before the next rising edge of the CK1248 signal. At the next rising edge of the CK1248 signal, the R3 and R2 data values in flip-flops J3 and J2 are latched into flip-flops K3 and K2, respectively, and the data values R1 and R0 are latched into flip-flops K1 and K0, respectively. These data values are provided at the output terminals of flip-flops K3–K0 as the output data signal R[3:0]. The timing of receive variable-width interface 800 for a 4-bit data path is illustrated in FIG. 10C.

8-Bit Data Path

When receive variable-width interface 800 is configured to have a 8-bit output width, the Y8, Y4, Y2, Y1 signals have values of (1,0,0,0) as illustrated in Table 6. In this case, width control circuit 900 generates enable signals EJ6_7, EJ4_5, EJ2_3, EK4_7, EK2_3, and EK1, and select signals T1 and T0 as illustrated in Table 10.

TABLE 10

| EJ6_7 | EJ4_5 | EJ2_3 | EK4_7 | EK2_3 | EK1 | T1 | T0 |
|---|---|---|---|---|---|---|---|
| CLK_A | CLK_B | CLK_C | 1 | 1 | 1 | 0 | CK2 |

Figure 10D:
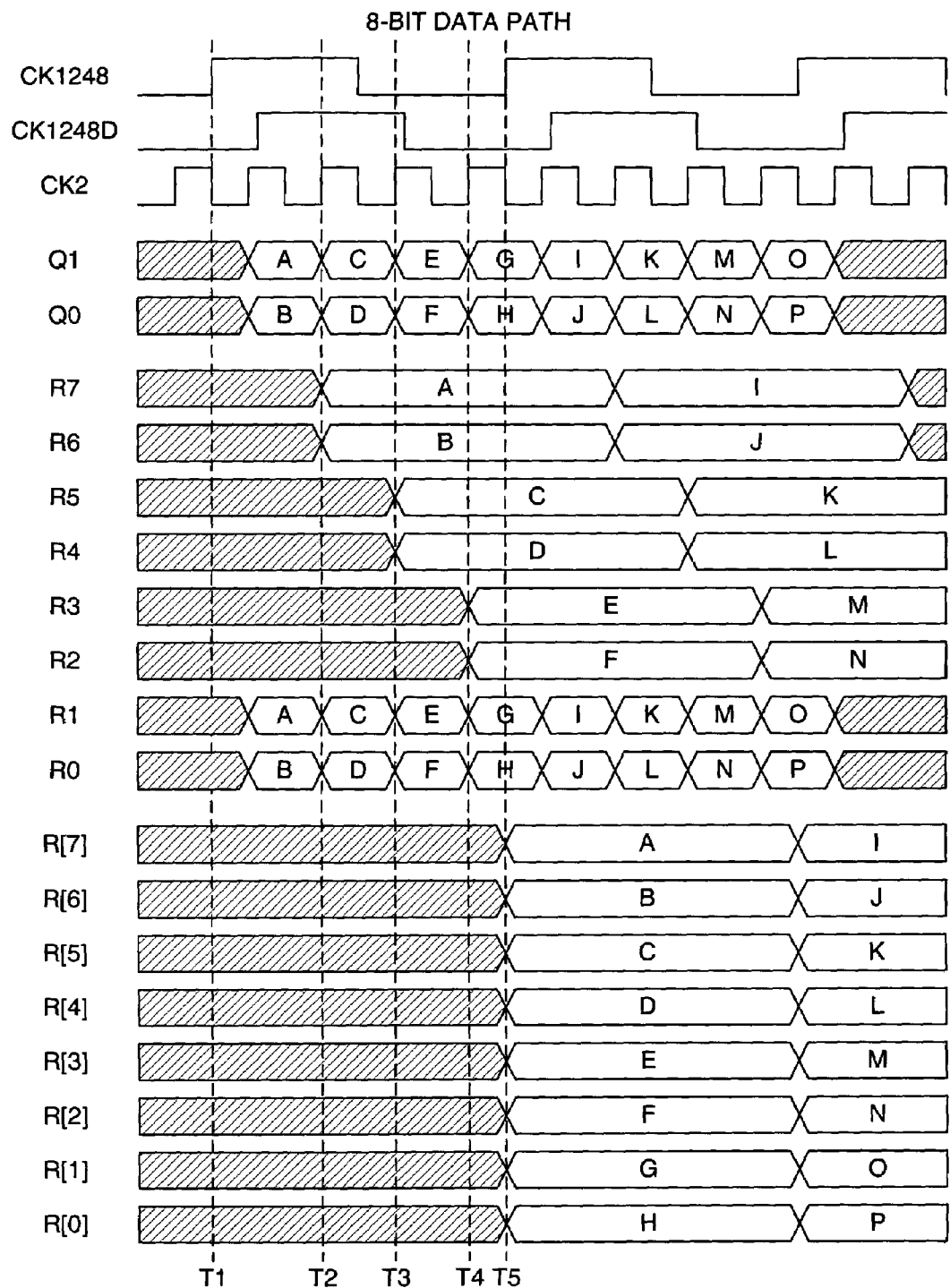
Figure 11:
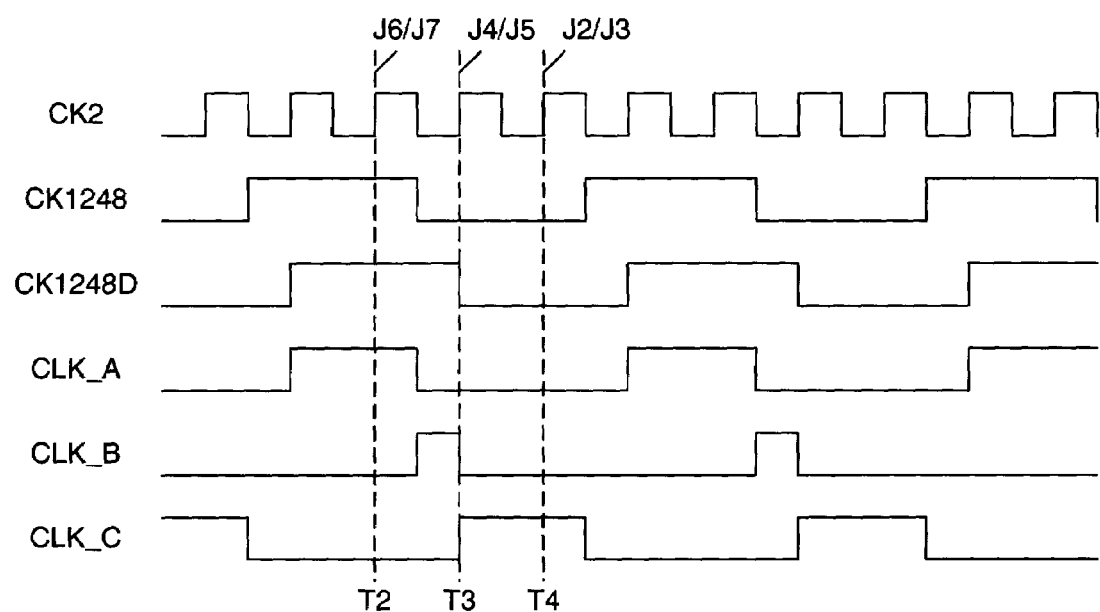
FIG. 11 is a waveform diagram of three clock signals (CLK_A, CLK_B and CLK_C) used to control the 8-bit wide data path of the receive variable-width interface of FIG. 8 in accordance with one embodiment of the present invention.

In Table 10, CLK_A is equal to the logical AND of CK1248D and CK1248; CLK_B is equal to the logical AND of CK1248D and CK1248#; and CLK_C is equal to the logical AND of CK1248# and CK1248D#. These clock signals are illustrated in FIG. 11. Turning to FIG. 8, these enable and select values have the following effect in receive variable-width interface 800. The logic "1" enable signals EK4_7, EK2_3 and EK1 enable flip-flops K1–K7. The CLK_A, CLK_B and CLK_C signals sequentially enable flip-flop sets J6–J7, J4–J5, and J2–J3, respectively. Successive rising edges of the CK2 signal (starting with the second rising edge of the CK2 signal after a rising edge of the CK1248 signal) latch data signals Q1 and Q0 into: flip-flops J7 and J6 (at time T2 in FIGS. 10D and 11); then flip-flops J5 and J4 (at time T3 in FIGS. 10D and 11); and then flip-flops J3 and J2 (at time T4 in FIGS. 10D and 11). The edge of the CK2 signal that stores data signals Q1 and Q0 into flip-flops J3 and J2 also latches new values Q1 and Q0, which propagate directly to flip-flops J1 and J0 sufficiently fast to satisfy the setup time requirements of R1 and R0, prior to the next rising edge of the CK1248 signal. The next rising edge of the CK1248 signal then stores the data values R7–R0 into flip-flops K7–K0, which are then provided as output data value R[7:0]. The timing of interface 800 for an 8-bit data path is illustrated in FIG. 10D.

By changing the values of data width selectors Y1, Y2, Y4 and Y8, interface 800 can be configured to operate using any of several supported data widths. Separate data width selectors may be provided for transmit variable-width interface 400 and receive variable-width interface 800. In a programmable FPGA environment, interfaces 400 and 800 advantageously avoid the use of programmable resources for the implementation of these interfaces, thereby enabling these interfaces to be implemented in an efficient manner.

Variations on the above implementations are possible. For example, the clock waveforms of FIGS. 3A–3D may be defined differently, depending on whether the data paths are positive-edge or negative-edge triggered, and whether it is required to avoid hold-time design issues.

The implementation of interface 400 described in connection with FIGS. 4 and 5 assume that the input data value D[7:0] should be provided directly to flip-flop inputs. If it is permissible to go to flip-flop inputs via minimal logic (i.e., a multiplexer), then flip-flops A1 and A01 may be merged into a single flip-flop, with other suitable modifications to the design. Such modifications would include the addition of a multiplexer that provides either the D[1] or D[0] data signal to the merged flip-flop, depending on the configuration of the data path.

The implementation described in FIGS. 8 and 9 makes certain assumptions about propagation delays from the source of Q[1:0]. Different assumptions might lead to not propagating Q[1:0] directly to flip-flops K1 and K0 for the 2-bit, 4-bit, and 8-bit data paths, or conversely, to bypassing flip-flops J2 and J3 for the 1-bit data path. Similarly, assumptions about propagation delays from P[1:0] in FIG. 4 could lead to bypassing flip-flops B1 and/or B0 in some cases.

The implementation in FIG. 8 defined the enable inputs so that each of flip-flops J2–J7 is written at most once per CK1248 cycle. An alternative design style would be to organize flip-flops J2–J7 as a shift register, unconditionally loaded (shifted) by each rising edge of CK2 and periodically loaded into flip-flops K0–K7 by the rising edge of CK1248. It is also possible to use a shift register methodology in transmit variable-width interface 400 of FIG. 4 as well.

In addition, interfaces 400 and 800 may be extended to support other data widths, or it may be constrained to support only a subset of the data widths.

Although the invention has been described in connection with several embodiments, it is understood that this invention is not limited to the embodiments disclosed, but is capable of various modifications, which would be apparent to a person skilled in the art. Logically equivalent but structurally different implementations are possible. Moreover, other variations in design style or detail may be possible. Thus, the invention is limited only by the following claims.

We claim:

1. An integrated circuit (IC) having programmable interconnections, the IC comprising:
    configurable logic having a transmit variable-width port and a receive variable-width port;
    a multi-gigabit transceiver having a transmit port and a receive port; and
    a transmit variable-width interface coupling the transmit variable-width port of the configurable logic and the receive port of the multi-gigabit transceiver; and
    a receive variable-width interface coupling the receive variable-width port of the configurable logic and the transmit port of the multi-gigabit transceiver.

2. The IC of claim 1, wherein the variable-width ports of the configurable logic are configurable to widths of 1N, 2N, 4N and 8N, wherein N is an integer.

3. The IC of claim 2, wherein the ports of the multi-gigabit transceiver have a width of 2N.

4. The IC of claim 1, wherein the transmit variable-width interface comprises:
    a first set of registers coupled to receive data values from the transmit variable width port of the configurable logic, wherein the first set of registers is clocked by a first clock signal; and
    a set of multiplexers coupled to the first set of registers, wherein the set of multiplexers is coupled to the receive port of the multi-gigabit transceiver.

5. The IC of claim 4, further comprising a second set of registers coupled to the set of multiplexers, wherein the second set of registers is clocked by a second clock signal.

6. The IC of claim 5, wherein the rising edges of the slower of the first and second clock signals are aligned with falling edges of the faster of the first and second clock signals.

7. The IC of claim 5, further comprising a delay flip-flop configured to delay the first clock signal by one half cycle of the second clock signal.

8. The IC of claim 4, further comprising a transmit data width control circuit configured to generate enable signals for the first set of registers.

9. The IC of claim 4, further comprising a transmit data width control circuit configured to generate control signals for the set of multiplexers.

10. The IC of claim 4, wherein the first clock signal is selected in conjunction with a selected width of the transmit variable-width port.

11. The IC of claim 1, wherein the transmit variable-width port and the receive variable-width port have different widths.

12. The IC of claim 1, wherein the receive variable-width interface comprises:
    a first set of registers coupled to receive data values from the transmit port of the multi-gigabit transceiver, wherein the first set of registers is clocked by a first clock signal; and
    a second set of registers coupled to receive data values from the first set of registers and provide data values to the receive variable-width port of the configurable logic, wherein the second set of registers is clocked by a second clock signal.

13. The IC of claim 12, further comprising a direct path between the transmit port of the multi-gigabit transceiver and a subset of the second set of registers.

14. A method of operating a device including configurable logic, configurable interconnections, a transceiver, and a variable-width interface circuit, the method comprising:
    configuring the configurable logic to have a transmit port coupled to the variable-width interface circuit, wherein the transmit port is selected to have a first width that is selected from a plurality of widths;
    routing data values having the first width from the configurable logic to the variable-width interface circuit on the transmit port in response to a first clock signal;
    converting the data values having the first width to data values having a second width using the variable-width interface circuit; and
    routing data values having the second width from the variable-width interface circuit to the transceiver in response to a second clock signal.

15. The method of claim 14, further comprising selecting the first clock signal in conjunction with the selected first width, wherein the rising edges of the slower of the first and second clock signals are aligned with falling edges of the faster of the first and second clock signals.

16. The method of claim 14, wherein the ratio of the first width to the second width is equal to the ratio of the frequency of the second clock signal to the frequency of the first clock signal.

17. The method of claim 14, further comprising:
routing data values having the second width from the transceiver to the variable-width interface circuit in response to the second clock signal;
converting the data values received from the transceiver having the second width to data values having a third width, which is selected from a plurality of widths, using the variable-width interface circuit;
configuring the configurable logic to have a receive port coupled to the variable-width interface circuit, wherein the receive port is selected to have the third width; and
routing data values having the third width from the variable-width interface circuit to the configurable logic on the receive port in response to a third clock signal.

18. The method of claim 17, wherein the first and third clock signals have the same frequency, and the first width is equal to the third width.

* * * * *